(12) United States Patent
Tanaka et al.

(10) Patent No.: US 7,348,269 B2
(45) Date of Patent: Mar. 25, 2008

(54) MANUFACTURING METHOD OF SEMICONDUCTOR DEVICE, SEMICONDUCTOR DEVICE, CIRCUIT BOARD, ELECTRO-OPTIC DEVICE, AND ELECTRONIC APPARATUS

(75) Inventors: Shuichi Tanaka, Chino (JP); Mitsuru Kuribayashi, Chino (JP)

(73) Assignee: Seiko Epson Corporation (JP)

( * ) Notice: Subject to any disclaimer, the term of this patent is extended or adjusted under 35 U.S.C. 154(b) by 81 days.

(21) Appl. No.: 11/311,800

(22) Filed: Dec. 19, 2005

(65) Prior Publication Data

US 2006/0154468 A1    Jul. 13, 2006

(30) Foreign Application Priority Data

Jan. 12, 2005    (JP)    ............... 2005-004844

(51) Int. Cl.
   *H01L 21/44*    (2006.01)
(52) U.S. Cl. .............. 438/613; 438/618; 257/737; 257/E23.021; 257/E23.069
(58) Field of Classification Search .............. 438/108, 438/612, 613, 618; 257/737, 738, 778, E23.021, 257/E23.069
   See application file for complete search history.

(56) References Cited

U.S. PATENT DOCUMENTS 5,677,246 A * 10/1997 Maeta et al. ................. 438/118

| 6,396,145 | B1 | 5/2002 | Nagai et al. |
| 7,218,008 | B2 * | 5/2007 | Kurosawa .................... 257/781 |
| 2002/0180843 | A1 * | 12/2002 | Irie et al. ....................... 347/70 |
| 2004/0229446 | A1 * | 11/2004 | Sorimachi ................... 438/463 |
| 2005/0006788 | A1 | 1/2005 | Kaneko |
| 2005/0162379 | A1 * | 7/2005 | Harada et al. .............. 345/107 |

FOREIGN PATENT DOCUMENTS

| JP | 02-272737 | 11/1990 |
| JP | 2001-110831 | 4/2001 |
| JP | 2001-189347 | 7/2001 |
| JP | 2003-203939 | 7/2003 |
| JP | 2004-186333 | 7/2004 |
| JP | 2004-266301 | 9/2004 |
| JP | 2005-5568 | 1/2005 |
| JP | 2005-101527 | 4/2005 |
| JP | 2005-136402 | 5/2005 |
| WO | WO 99/65075 | 12/1999 |

* cited by examiner

*Primary Examiner*—Quoc Hoang
(74) *Attorney, Agent, or Firm*—Harness, Dickey & Pierce, P.L.C.

(57) ABSTRACT

A method for manufacturing a semiconductor device with a bump electrode wherein the bump electrode includes a resin material as a core and at least a top surface covered with a conductive film. The method includes placing the resin material on a substrate on which an electrode terminal is formed by an inkjet method, and forming an interconnecting metal that connects the electrode terminal to a top surface of the resin material.

14 Claims, 12 Drawing Sheets

MANUFACTURING METHOD OF SEMICONDUCTOR DEVICE, SEMICONDUCTOR DEVICE, CIRCUIT BOARD, ELECTRO-OPTIC DEVICE, AND ELECTRONIC APPARATUS

RELATED APPLICATIONS

This application claims priority to Japanese Patent Application No. 2005-004844 filed Jan. 12, 2005 which is hereby expressly incorporated herein by reference in its entirety.

BACKGROUND OF THE INVENTION

1. Technical Field

The present invention relates to a manufacturing method of a semiconductor device, a semiconductor device, a circuit board, an electro-optic device, and an electronic apparatus.

2. Related Art

In circuit boards, liquid crystal displays, and the like mounted on various types of electronic apparatuses, various techniques to mount electronic components such as semiconductor integrated circuits (ICs) thereon have been used. On the liquid crystal display, for example, an integrated circuit (IC) chip for driving a liquid crystal panel is mounted. The IC chip is sometimes mounted directly on a glass substrate constituting the liquid crystal panel, and is sometimes mounted on a flexible printed circuit (FPC) board mounted on the liquid crystal panel. The former mounting structure is referred to as a chip on glass (COG) structure, and the latter mounting structure as a chip on FPC (COF) structure.

There is a technique of locating an elastic body between an IC chip and the wiring at the side of a substrate in mounting the IC chip. As examples thereof, a method in which an anisotropic conductive film (ACF) containing conductive particles dispersed in a thermosetting resin is placed between electrode terminals, a method of using a bump electrode having elasticity, and so on are known.

In the method of using a bump electrode having elasticity, for example, a resin projection is formed on the active surface of an IC chip and then a conductive film is formed on a surface of the resin projection. A bump electrode is thereby made (e.g. refer to JP-A-2-272737, which is an example of related art). A conductive film on the surface of the bump electrode is electrically connected to an electrode terminal of the IC chip. By pressing the bump electrode against a terminal of the substrate, elastic deformation occurs on the resin projection constituting the bump electrode. By fixing the IC chip to the substrate with a thermosetting resin in this state, conductive contact through the bump electrode is maintained even if the thermosetting resin thermally expands due to a temperature change.

In general, the resin projection constituting the bump electrode is formed by a photolithography method. Namely, a photoresist is applied onto a substrate by using a spin coating technique and the photoresist film is exposed to light through a mask for patterning, is then developed by using a developing fluid, and is hardened by baking at high temperature. The conductive film constituting the bump electrode is typically formed by a soldering method.

There have been demands in electronic components such as IC chips for stabilizing quality as well as reducing cost. Establishing a manufacturing method to meet such demands is desired.

SUMMARY

An advantage of the invention is to provide a method for manufacturing a semiconductor device by which the film thickness of a bump electrode can be made larger and the manufacturing cost can be reduced.

The manufacturing method is a method of manufacturing a semiconductor device with a bump electrode. The bump electrode includes a resin material as its core and has at least its top covered with a conductive film. The method includes placing the resin material on a substrate on which an electrode terminal is formed by an inkjet method, and forming an interconnecting metal that connects the electrode terminal to the top of the resin material.

According to this semiconductor device manufacturing method, a resin material that constitutes the core of the bump electrode is formed by using the inkjet method, and thus the film thickness of the bump electrode is made larger and the manufacturing cost is reduced. That is, since a material can be provided in a desired local area on the substrate in the inkjet method, the process of film formation is relatively simple and wastes less material. In addition, since the amount of resin material provided and the timing of providing it can be controlled part by part, the film thickness of the material film is easily made larger according to the characteristics of the material used.

For example, the resin material may be placed by dropping a plurality of droplets from a discharger, whereby the shape of a film made of the resin material can be arbitrarily determined and the thickness of the film can be made larger by stacking the resin material.

The discharger may be structured to have a plurality of nozzles for discharging a droplet.

By dropping droplets including the resin material from the plurality of nozzles, the amount of resin material provided and the timing of providing it can be controlled part by part.

In the manufacturing method described above, placing the resin material and drying the resin material may be repeated, whereby the dried films made of the resin material may be stacked to be made thicker.

It is preferable that the manufacturing method described above includes processing at least part of an area of a surface of the substrate to be lyophobic to the resin material before placing the resin material.

Being lyophobic as described herein means showing non-affinity to the resin material.

Hence, it is possible to control the spread of the droplets placed on the substrate which makes the pattern thicker as well as controls the film shape.

In the manufacturing method described above, for example, a resin projection extending linearly at approximately the same height may be formed on the substrate by placing the resin material. A plurality of resin projections aligned on approximately the same straight line may also be formed on the substrate by placing the resin material.

In the manufacturing method described above, the interconnecting metal may be formed by using an inkjet method.

Forming the interconnecting metal by using an inkjet method makes the interconnecting metal thicker and reduces the manufacturing cost.

In this case, placing a droplet containing a material for forming the interconnecting metal at every certain distance on the substrate is repeated while shifting a starting position to place the droplet to prevent the occurrence of a bulge caused by coalescence of droplets.

A semiconductor device according to an aspect of the invention is manufactured by using the manufacturing method described above.

Due to this semiconductor device, quality stabilization is attained by making the bump electrode thicker; and cost decrease is attained by simplifying the manufacturing processes and reducing materials used.

A circuit board according to an aspect of the invention has the semiconductor device described above mounted thereon.

This circuit board leads to attaining quality stabilization and cost reduction.

An electro-optic device according to an aspect of the invention has the circuit board described above.

This electro-optic device leads to attaining quality stabilization and cost reduction.

An electronic apparatus according to an aspect of the invention has the electro-optic device described above.

This electronic apparatus leads to attaining quality stabilization and cost reduction.

BRIEF DESCRIPTION OF THE DRAWINGS

The invention will be described with reference to the accompanying drawings, wherein like numbers refer to like elements.

DESCRIPTION OF THE EMBODIMENT

Figure 1:
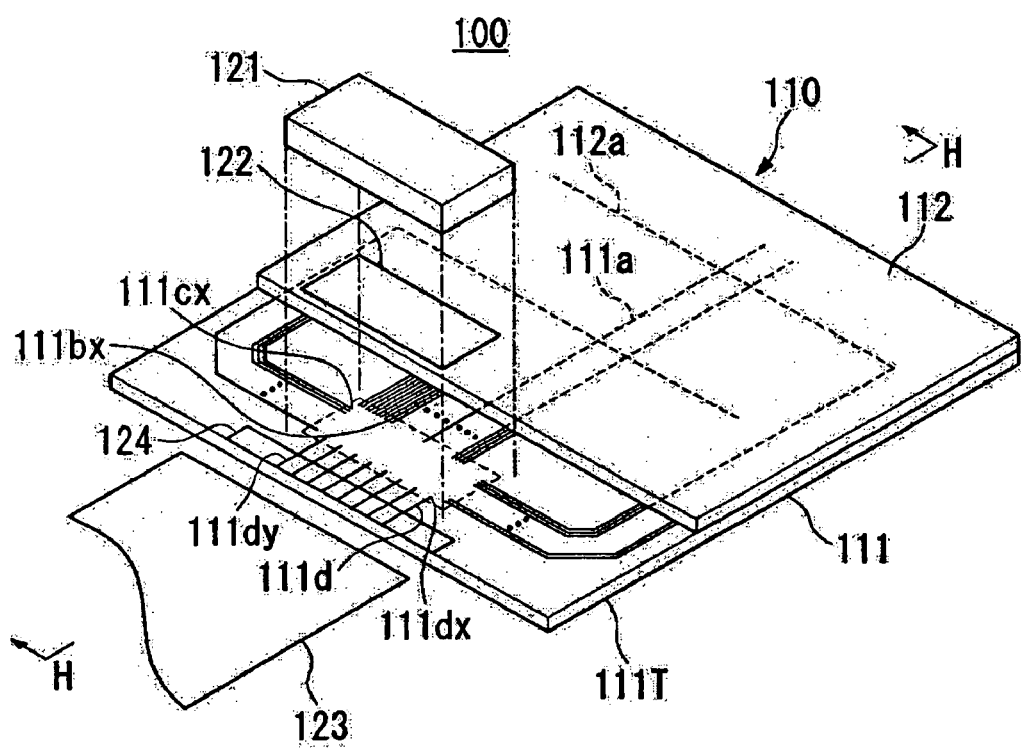
FIG. 1 is a schematic view showing a liquid crystal display that is an embodiment of an electro-optic device.

An embodiment of the invention will now be described. The scale between elements illustrated in the drawings referred to below may be different from the actual scale.

Electro-optic Device

FIG. 1 is a schematic view showing a liquid crystal display that is an embodiment of an electro-optic device of the invention. A liquid crystal display 100, which is shown, has a liquid crystal panel 110 and a semiconductor device 121. Auxiliary members such as a polarizing plate, a reflection sheet, and a backlight, which are not shown, are also suitably provided as desired.

The liquid crystal panel 110 includes substrates 111 and 112 made of glass, plastic, and the like. The substrates 111 and 112 are disposed facing each other and are laminated together with a sealing material, or the like, which is not shown. A liquid crystal (not shown), which is an electro-optic substance, is sealed between the substrates 111 and 112. An electrode 111a made of a transparent conductor such as indium tin oxide (ITO) is formed on the inside surface of the substrate 111, and an electrode 112a disposed facing the electrode 111a mentioned above is formed on the inside surface of the substrate 112. The electrodes 111a and 112a are disposed orthogonally to each other. The electrodes 111a and 112a are extended to a protruding portion 111T of the substrate (hereinafter, referred to as a "substrate protruding portion") and have electrode terminals 111bx and 111cx formed at their ends, respectively. Input wiring 111d is formed in the vicinity of the edge of the substrate protruding portion 111T, and a terminal 111dx is formed in an inner end of the wiring.

The semiconductor device 121 is mounted on the substrate protruding portion 111T with a sealing resin 122 disposed therebetween. The semiconductor device 121 is an IC chip for driving a liquid crystal, which drives, for example, the liquid crystal panel 110. Many bump electrodes, which are not shown, are formed on the underside of the semiconductor device 121 and are conductively connected to the terminals 111bx, 111cx, and 111dx on the substrate protruding portion 111T.

A flexible wiring board 123 is attached on the input terminals 111dy formed in an outer end of the input wiring 111d, having an ACF 124 interposed therebetween. The input terminals 111dy are conductively connected to wiring, which is not shown, disposed on the flexible wiring board 123. Control signals, picture signals, power supply potentials and so on are supplied from the outside through the flexible wiring board 123 to the input terminals 111dy, and driving signals for driving a liquid crystal are generated in the semiconductor device 121 to be supplied to the liquid crystal panel 110.

According to the liquid crystal display 100 of the embodiment structured as described above, a suitable voltage is applied between the electrode 111a and the electrode 112a through the semiconductor device 121, so that liquid crystals of pixels in which the electrodes 111a and 112a are disposed opposite to each other can be reoriented to modulate light. A desired image can thus be formed in a display area, in which the pixels are arranged, in the liquid crystal panel 110.

Figure 2:
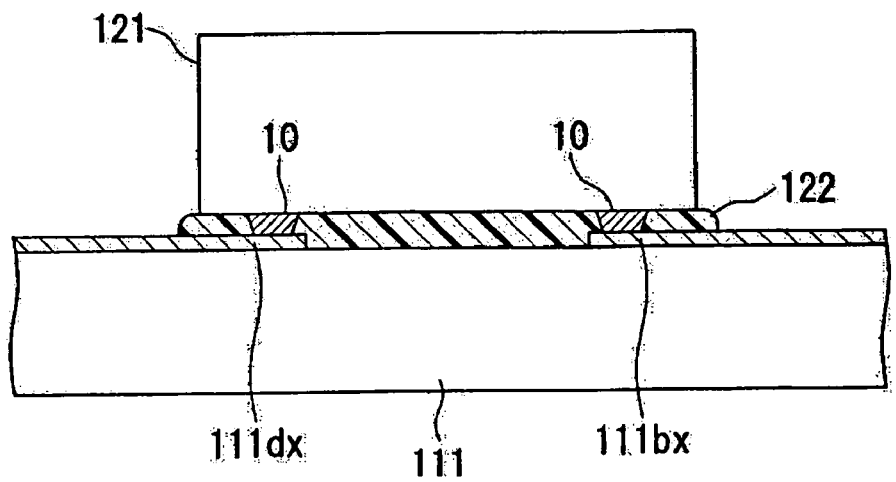
FIG. 2 is a view for explaining a mounting structure of a semiconductor device on the liquid crystal display.

FIG. 2 is a side sectional view taken along the line H-H of FIG. 1 and explains a mounting structure of the semiconductor device 121 on the liquid crystal display 100 mentioned above. As shown in FIG. 2, a plurality of bump electrodes 10 as terminals at the side of IC are placed on an active surface (the lower surface shown in the drawing) of the semiconductor device 121 and have their ends in direct conductive contact with the terminals 111bx and 111dx of the substrate 111 mentioned above. The periphery of the conductive contact area between the bump electrodes 10 and the terminals 111bx and 111dx is filled with the cured sealing resin 122 made of a thermosetting resin, or the like.

Semiconductor Device

Figure 3:
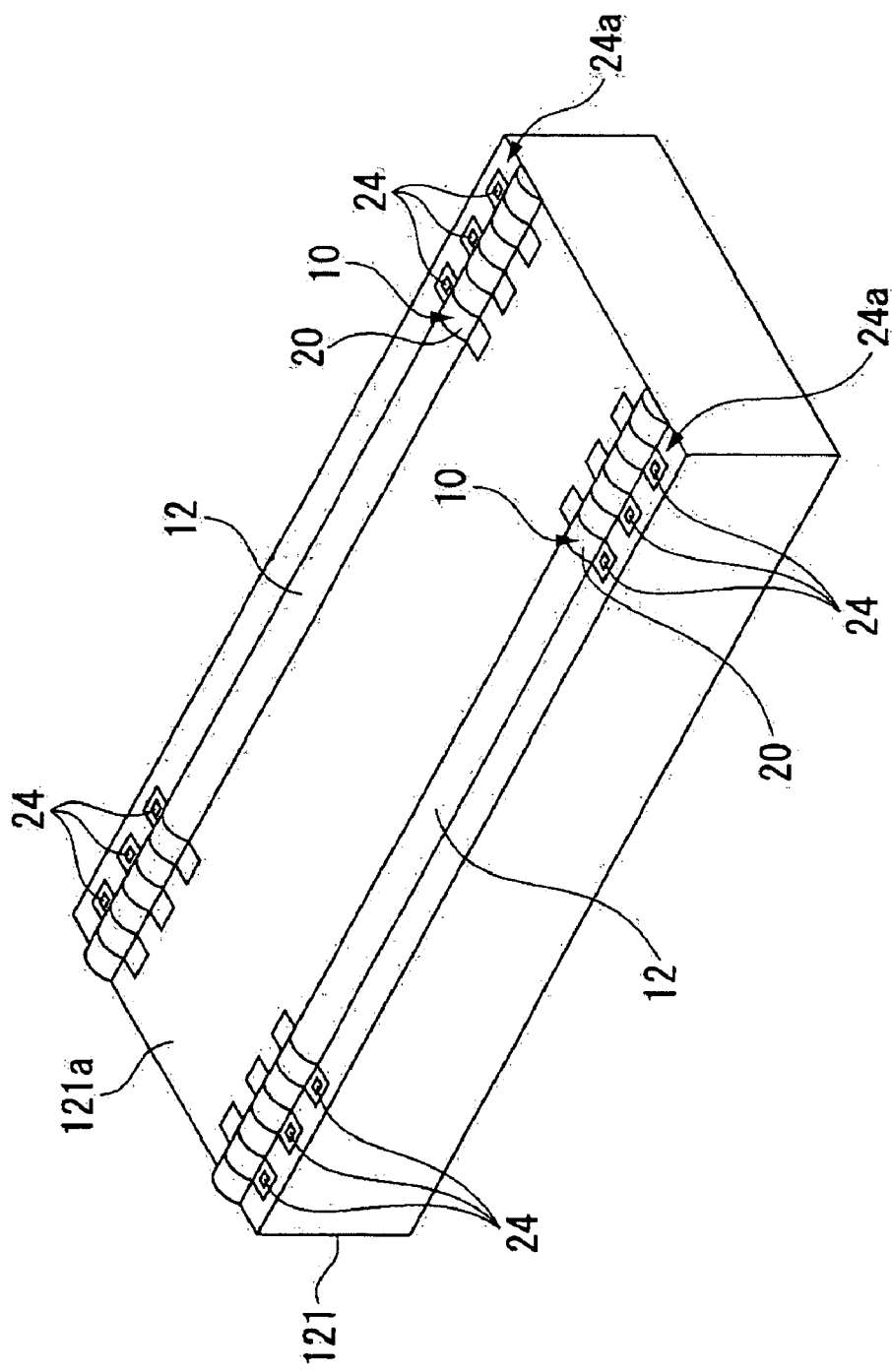
FIG. 3 is a perspective view of the semiconductor device.

The terminal structure of the semiconductor device 121 will now be described. FIG. 3 is a partial perspective view that shows a structure of the active surface side of the semiconductor device 121, on which terminals are formed.

The semiconductor device 121 is, for example, an IC chip that drives pixels of the liquid crystal display. On its active surface side, an electronic circuit (integrated circuit) including a plurality of electronic elements such as thin film transistors, interconnects that connect electronic elements, and the like (all not shown) are formed.

In the semiconductor device 121 shown in FIG. 3, a plurality of electrode pads 24 are arranged in lines along the longitudinal sides of an active surface 121a. The electrode pads 24 are extended from the electronic element, etc. described above, and serve as external electrodes of the electronic circuit. Inside electrode pad lines 24a on the active surface 121a, resin projections 12 that are linearly consecutive, aligned along the electrode pad lines 24a are formed. A plurality of conductive films 20 acting as interconnecting metals that connect the electrode pads 24 to the tops of the resin projections 12 are formed from the surfaces of the electrode pads 24 to the surfaces of the resin projections 12. The bump electrode 10 is structured to include the resin projection 12 as its core and each conductive film 20 arranged on the surface of the resin projection 12. The resin projections 12 are arranged inside the electrode pad lines 24a in FIG. 3, but may be arranged outside them.

Figure 4A:
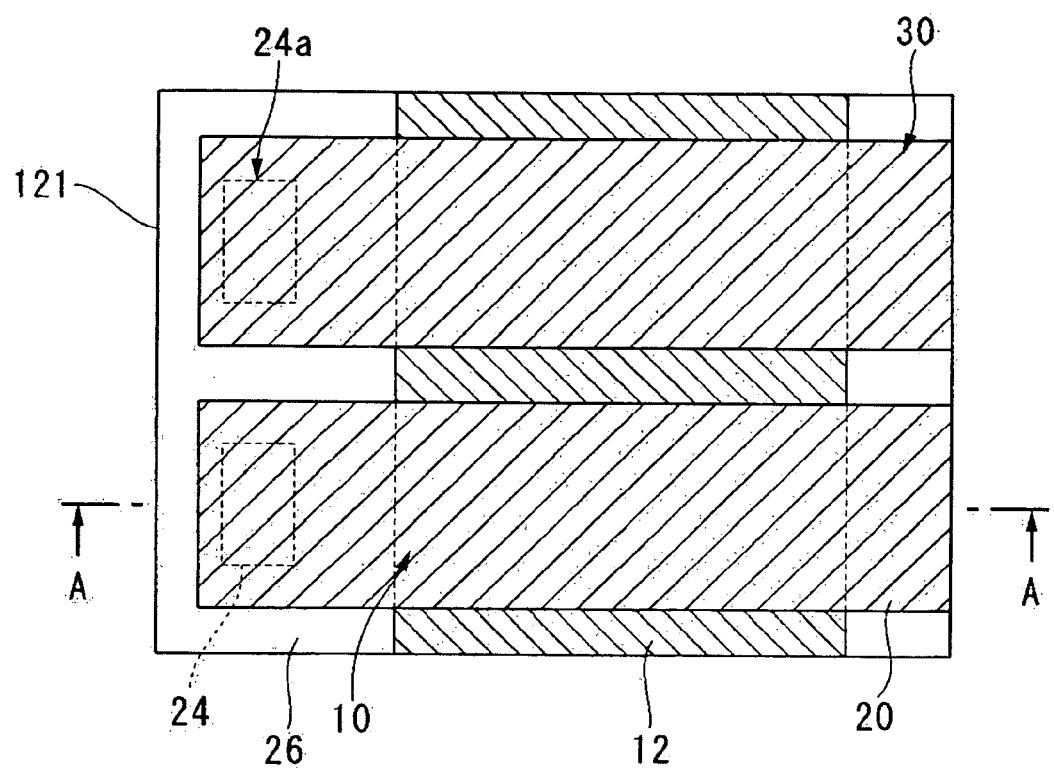
FIGS. 4A and 4B are enlarged views showing terminals of the semiconductor device.
Figure 4B:
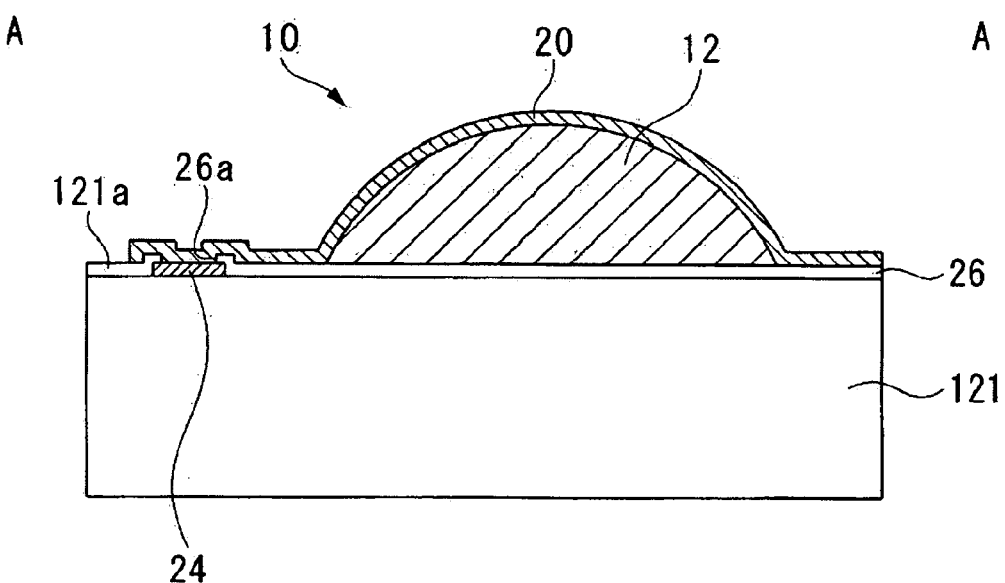

FIGS. 4A and 4B are views showing a substantial part of the bump electrode 10; FIG. 4A is an enlarged plan view of the periphery of the bump electrode and FIG. 4B is a side sectional view taken along the line A-A of FIG. 4A.

The resin projections 12 are formed on the surface of the passivation film 26 inside the electrode pad lines 24a. The resin projections 12 are formed protruding from the active surface 121a of the semiconductor device 121, and extend linearly with approximately the same height, aligned parallel to the electrode pad lines 24a. The resin projections 12 are made of a resin material with elasticity such as polyimide resin, acrylic resin, phenol resin, epoxy resin, silicone resin, or modified polyimide resin, and are formed by using an inkjet method. It is desirable that the shape of cross section of the resin projection 12 be a shape allowing elastic deformation to readily occur, such as semicircle or trapezoid as shown in FIG. 4B. Thus, elastic deformation of the bump electrode 10 can readily occur when the bump electrode is in contact with the other substrate, leading to reliability improvement in conductive connection to the other substrate.

The plurality of conductive films 20 acting as interconnecting metals that connect the electrode pads 24 to the tops of the resin projections 12 are formed from the surfaces of the electrode pads 24 to the surfaces of the resin projections 12. The conductive film 20 is made of a conductive material such as Au, Ag, TiW, Cu, Ni, Pd, Al, Cr, Ti, W, NiV or lead-free solder. The conductive film 20 is formed by using the inkjet method in this example, but other methods may be used. For example, film formation is performed by depositing or sputtering a conductive metal such as Ai, Cu, or Ni, and suitable patterning is applied to the film, thereby enabling the completion of the conductive film. Alternatively, it is possible that the surface of the base conductive film made of Cu, Ni, Al, or the like is further covered with Au solder or the like to enhance its conductive contact.

The conductive film 20 extends from the electrode pad 24 to the opposite side, with the resin projection 12 sandwiched therebetween. At the opposite side, the conductive film adheres to the active surface 121a. That is, the conductive film 20 adheres to the surfaces of the electrode pads 24 located at the outside of the resin projection 12, and is formed along the surface of the resin projection 12 to the active surface 121a located at the inside of the resin projection 12, forming an adhesion surface where the conductive film adheres to the passivation film 26 disposed on the inside active surface 121a. Accordingly, the conductive film 20 is fixed to the active surface on both sides of the resin projection 12, and thus has a structure in which removal of the conductive film and other problems are unlikely to occur when forming a joint with the opposite substrate. The shape of the conductive film 20 is not limited to this, and can be modified; the conductive film 20 only has to be formed at least between the electrode pad 24 and the top of the resin projection 12.

As shown in FIG. 1 referred to above, the bump electrode 10 is bonded by thermocompression to the terminal 111bx on the substrate 111 with the sealing resin 122 interposed therebetween. The sealing resin 122 is a thermosetting resin, being uncured or semi-cured before mounting. If being uncured, the sealing resin 122 simply has to be applied to the active surface of the semiconductor device 121 (undersurface shown in the drawing) or a surface of the substrate 111. If being semi-cured, the sealing resin 122 simply is inserted in a film or sheet shape between the semiconductor device 121 and the substrate 111. An epoxy resin is usually used as the sealing resin 122, but other resins are sufficient if they can attain the same purpose.

Mounting of the semiconductor device 121 is performed by using a head for applying pressure and heat, which is not shown. The semiconductor device 121 is mounted on the substrate 111 by applying pressure while also applying heat to the semiconductor device 121. In this process, the sealing resin 122 is softened at an early stage by application of heat, and the top of the bump electrode 10 seemingly pushes the softened resin apart to come into conductive contact with the terminal 111bx. The resin projection 12, which is the internal resin, is pushed down by the above application of pressure to have elastic deformation in the contact direction (vertical direction shown in the drawing). When heat is further applied in this state, a cross-linking chemical reaction occurs, so that the sealing resin 122 is cured. By the sealing resin 122, the bump electrode 10 is kept in the state of having an elastic deformation while conductively contacting the terminal 111bx even when the added pressure is released.

Manufacturing Method of Semiconductor Device

A manufacturing method of the semiconductor device according to the invention, especially a process of forming the bump electrode 10, will now be described.

Figure 5A:
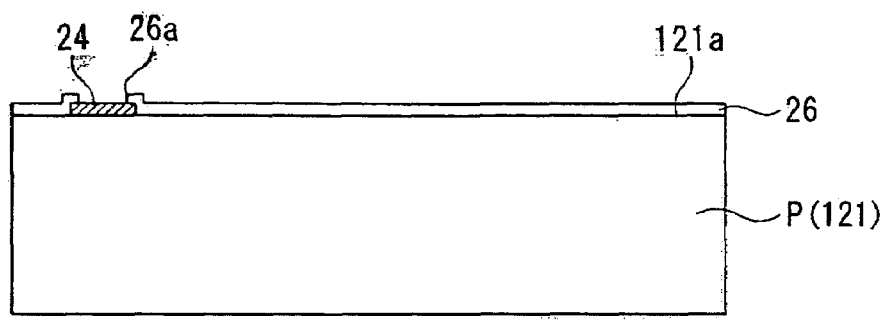
FIGS. 5A to 5C are views showing processes for explaining a manufacturing method of the semiconductor device.
Figure 5B:
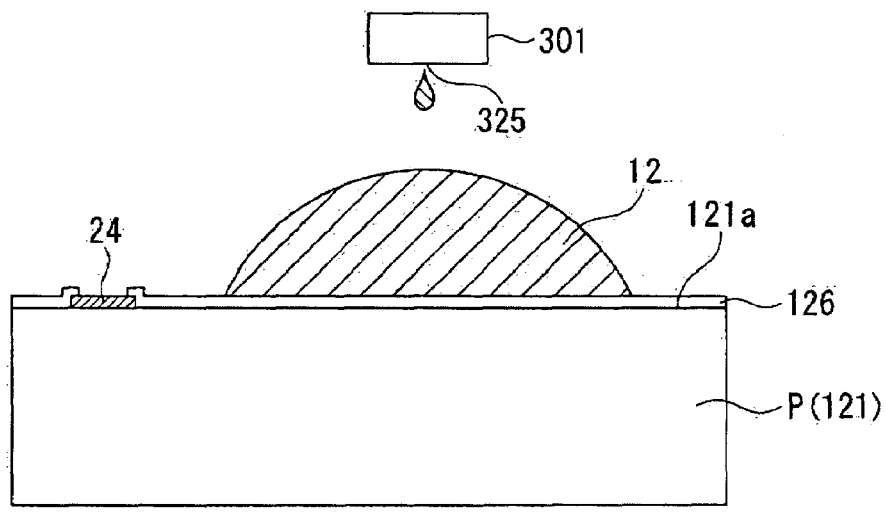
Figure 5C:
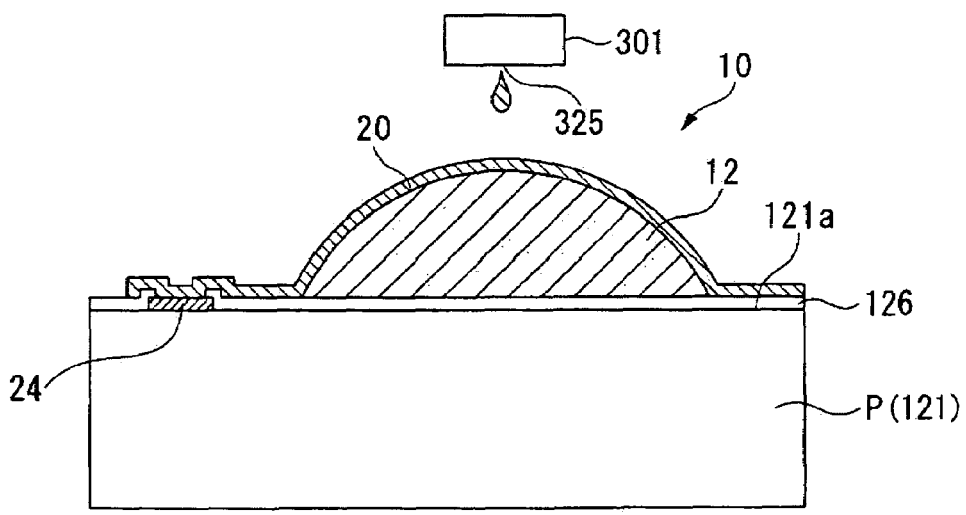

FIGS. 5A to 5C are process views showing an exemplary manufacturing method of the semiconductor device 121. Theses manufacturing processes include a process for forming the passivation film 26 (FIG. 5A), a process for forming the resin projection 12 (FIG. 5B), and a process for forming the conductive film 20 (FIG. 5C). In this example, the resin projection 12 and the conductive film 20 are formed by using an inkjet method.

First, the passivation film 26 is formed on the active surface 121a of a substrate P on which semiconductor elements are formed, as shown in FIG. 5A. That is, after the passivation film 26 made from SiO2, SiN, or the like is formed on the substrate P by a film formation method, the opening 26a is formed by patterning with the use of a photolithography method. In the formation of the opening 26a, a resist layer is formed on the passivation film 26 by a spin coating method, a dipping method, a spray coating method, or the like, and exposure and processing are applied to the resist layer using a mask having a predetermined pattern formed so as to form a resist pattern with a predetermined shape (not shown). Thereafter, etching of the aforementioned film using this resist pattern as a mask is performed to expose the electrode pad 24. The opening 26a is formed and the resist pattern is removed by using a stripper, etc. It is preferable to use dry etching for etching in this process; reactive ion etching (RIE) is preferably used as the dry etching. Wet etching may alternatively be used for the etching.

Next, the resin projection 12 is formed on the active surface 121a of the substrate P on which the electrode pad 24 and the passivation film 26 are formed by using the inkjet method as shown in FIG. 5B. That is, a droplet-shaped resin material (liquid material) for which the liquid amount per drop is controlled is discharged (dropped) from a nozzle 325 provided in a head 301, while the nozzle 325 is placed to face the substrate P, and the nozzle 325 and the substrate P are moved relatively with respect to each other. Thus, a film pattern made of the resin material in a desired shape is formed on the substrate P. By applying a heat treatment to the film pattern, the resin projection 12 is obtained.

Placing the resin material by dropping a plurality of droplets from the head 301 enables the shape of a film made of the resin material to be arbitrarily determined and the film thickness of the resin projection 12 to be made larger by stacking the resin material. For example, by repeating a process of placing a resin material on the substrate P and a process of drying the resin material, the dried films made of the resin material are stacked so as to reliably make the resin projection 12 thicker. By dropping droplets including the resin material from the plurality of nozzles 325 provided in the head 301, the amount of resin material provided and the timing of providing it can be controlled part by part. A detailed example of placing a material using the inkjet method will be described later.

Next, the conductive film 20 acting as an interconnecting metal that connects the electrode pad 24 to the top of the resin projection 12 is formed from the surface of the electrode pad 24 to the surface of the resin projection 12, as shown in FIG. 5C. That is, a droplet-shaped conductive material (liquid material) for which the liquid amount per drop is controlled is discharged (dropped) from the nozzle 325 provided in the head 301, while the nozzle 325 is placed to face the substrate P, and the nozzle 325 and the substrate P are moved relatively with each other. Thus, a film pattern is formed on the substrate P. By applying a heat treatment to the film pattern, the conductive film 20 is obtained.

Placing the conductive material by dropping a plurality of droplets from the head 301 enables the shape of a film including the conductive material to be arbitrarily determined and the film thickness of the conductive film 20 to be made larger by stacking the layers. For example, by repeating a process of placing a conductive material on the substrate P and a process of drying the conductive material, the dried films made of the conductive material are stacked so as to reliably make the resin projection 12 thicker. By dropping droplets including a conductive material from the plurality of nozzles 325 provided in the head 301, the amount of the conductive material provided and the timing of providing it can be controlled part by part.

By the processes described above, the bump electrode 10 having a resin material as its core is formed on the substrate P so that the semiconductor device 121 with the bump electrode 10 is manufactured. Another conductive film may be formed on the surface of the conductive film 20, and a functional film having a predetermined function such as inhibiting oxidation may also be formed.

In this semiconductor device manufacturing method, the resin material that constitutes the core of the bump electrode 10 is formed by using the inkjet method, and thus making the film thickness of the bump electrode 10 larger and reducing the manufacturing cost are readily attained.

That is, since the material can be provided in a desired local area on the substrate P in the inkjet method, the process of film formation is simple and wastes less material as compared to a photolithography method. In addition, since the amount of resin material provided and the timing of providing it can be controlled part by part, the film thickness of the material film is easily made larger according to the characteristics of the material used.

In this manufacturing method, the conductive film 20 is formed by using the inkjet method, and thus making the film thickness of the conductive film 20 larger and reducing its manufacturing cost are attained.

As a result, for the semiconductor device 121 manufactured by this manufacturing method, quality stabilization is attained by making the film thickness of the bump electrode 10 larger, and low cost is achieved by simplifying the manufacturing processes as well as reducing materials used.

Figure 6:
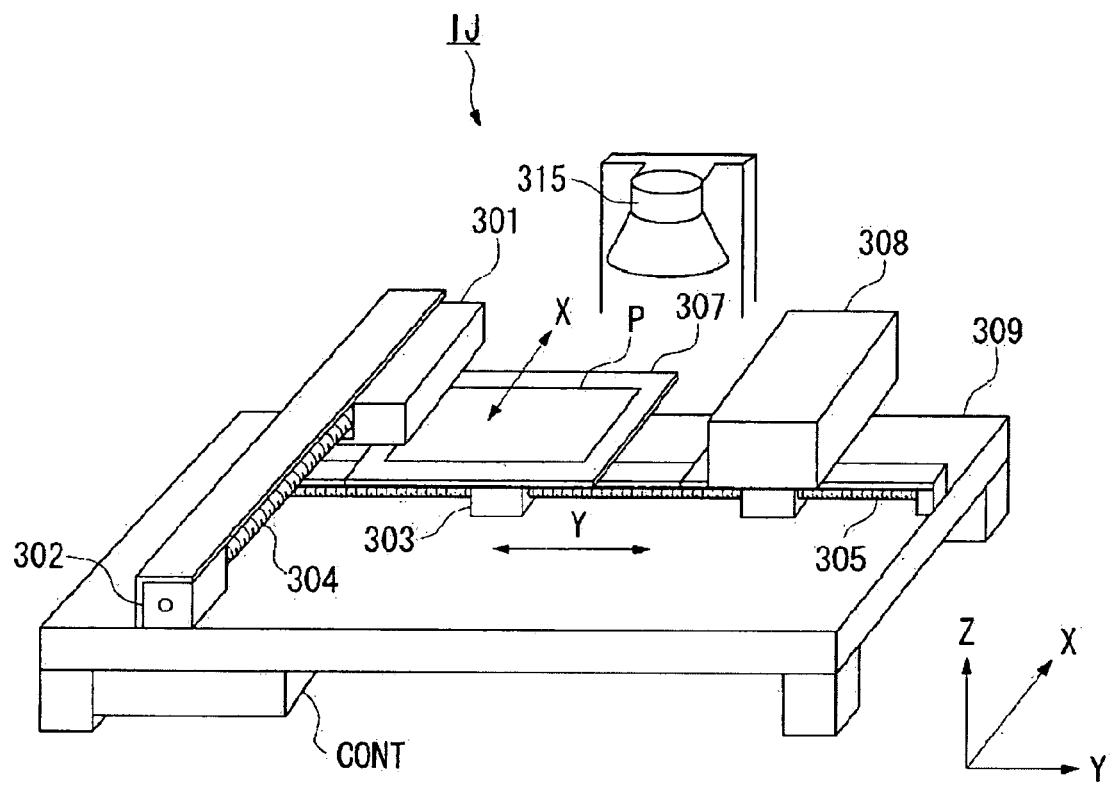
FIG. 6 is a perspective view showing an overall structure of an inkjet device.

FIG. 6 is a perspective view showing an overall structure of an ink-jet device IJ used in the inkjet method.

The inkjet device IJ, which discharge material ink in a droplet shape from a nozzle of a droplet discharge head (inkjet head), is structured to include the droplet discharge head 301, an X axis direction drive axis 304, a Y axis direction guide axis 305, a control unit CONT, a stage 307, a cleaning mechanism 308, a base 309, a heater 315, etc.

The stage 307 supports the substrate P (the semiconductor device 121 in this example) on which ink (liquid material) is placed by the inkjet device IJ, and includes a fixation mechanism (not shown) to fix the substrate P to a reference position.

The droplet discharge head 301 is a multi-nozzle type droplet discharge head having a plurality of discharge nozzles, and its longitudinal direction matches the Y axis direction. The plurality of nozzles are provided on the underside of the droplet discharge head 301 at regular spacing, aligned along the Y axis direction. The discharge nozzles of the droplet discharge head 301 discharge (drop) ink to the substrate P supported by the stage 307.

An X axis direction drive motor 302 is connected to the X axis direction drive axis 304. The X axis direction drive motor 302 is a stepping motor or the like, and rotates the X axis direction drive axis 304 when a driving signal in the X axis direction is supplied from the control unit CONT. When the X axis direction drive axis 304 is rotated, the droplet discharge head 301 moves in the X axis direction.

The Y axis direction guide axis 305 is fixed to the base 309 not to move. The stage 307 includes the Y axis direction drive motor 303. The Y axis direction drive motor 303 is a stepping motor or the like, and transfers the stage 307 in the Y axis direction when a driving signal in the Y axis direction is supplied from the control unit CONT.

The control unit CONT supplies a voltage for controlling discharge of droplets to the droplet discharge head 301. The control unit CONT also supplies a drive pulse signal to control movement of the droplet discharge head 301 in the X axis direction to the X axis direction drive motor 302 and a drive pulse signal to control movement of the stage 307 in the Y axis direction to the Y axis direction drive motor 303.

The cleaning mechanism 308 cleans the droplet discharge head 301. A Y axis drive motor (not shown) is included in the cleaning mechanism 308. Driven by the Y axis direction drive motor, the cleaning mechanism moves along the Y axis direction guide axis 305. The movement of the cleaning mechanism 308 is also controlled by the control unit CONT.

The heater 315, which is a means for heat treating the substrate P by lamp annealing in this device, vapors and dries a solvent included in a liquid material placed on the substrate P. Switching power supply of the heater 315 on and off is also controlled by the control unit CONT.

Figure 7:
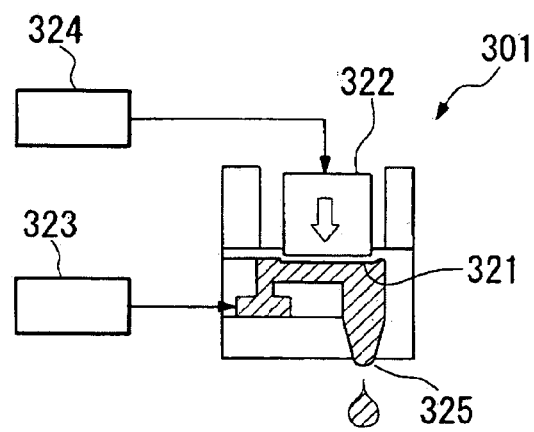
FIG. 7 is a view for explaining a discharging principle of a liquid material by a piezoelectric method.

FIG. 7 is a schematic structure view of a droplet discharge head for explaining a discharging principle of a liquid material by a piezoelectric method.

In FIG. 7, a piezo element 322 is placed adjacent to a liquid chamber 321 that contains a liquid material (ink). The liquid material is supplied to the liquid chamber 321 through a liquid material supply system 323 including a material tank that contains the liquid material. The piezo element 322 is connected to a drive circuit 324, through which a voltage is applied to the piezo element 322. Therefore, the piezo element 322 is deformed, causing elastic deformation of the liquid chamber 321. The liquid material is discharged from the nozzle 325 depending on the variation of the internal volume at the time of the elastic deformation. In this case, a strain amount of the piezo element 322 can be controlled by altering a value of applied voltage. A strain velocity of the piezo element 322 can also be controlled by altering a frequency of the applied voltage. The droplet discharge by the piezoelectric method does not add heat to a material, and therefore has an advantage of having less effect on composition of the material.

Returning to FIG. 6, the inkjet device IJ discharges (drops) a liquid material in a droplet shape from the head 301 to the substrate P while making the head 301 and the stage 307 supporting the substrate P move and scan relatively with each other. The discharge nozzles of the head 301 are arranged in a line at least in the Y axis direction, which is non-scanning direction, at regular spacing (X axis direction: scanning direction, Y axis direction: non-scanning direction). The droplet discharge head 301 is disposed perpendicular to the progress direction of the substrate P in FIG. 6, but may be disposed to cross the progress direction of the substrate P by adjusting an angle of the droplet discharge head 301. Thus, the pitch between nozzles can be adjusted by adjusting an angle of the droplet discharge head 301. Arbitrary adjustment of a distance between the substrate P and the surface of nozzles may be employed.

Ink (liquid material) used in this example that is preferable for discharge from the droplet discharge head 301 will now be described.

Ink (liquid material) used in the embodiment includes a solution containing a resin material solved in a solvent (liquid material of the resin projection), a dispersion liquid containing conductive fine particles dispersed in a dispersion medium (liquid material of the conductive film), or their precursors. Besides metal fine particles such as gold, silver, copper, palladium, niobium, and nickel, fine particles of their precursors, alloys, oxides, and conductive polymers as well as indium tin oxide, etc., are used as conductive fine particles. These conductive fine particles can also be used with their surfaces coated with organic substances in order to improve their dispersibility. It is preferable that the conductive fine particle size be around 1 nm to 0.1 μm. If the size is greater than 0.1 μm, not only may clogging in the nozzles of the head 301 occur, but also the density of the obtained film can be degraded. If the size is smaller than 1 nm, a volume ratio of a coating agent to conductive fine particles becomes large, so that the rate of organic substances in the obtained film becomes excessive.

It is necessary that the solvent can solve the above resin and the dispersion medium can disperse the above conductive fine particles, and both do not cause aggregation, but there is no other particular restriction on them. For example, water; alcohols such as methanol, ethanol, propanol, and butanol; hydrocarbon-based compounds such as n-heptane, n-octane, decane, dodecane, tetradecane, toluene, xylene, cymene, durene, indene, dipentene, tetrahydronaphthalene, decahydronaphthalene, and cyclohexylbenzene; ether-based compounds such as ethylene glycol dimethyl ether, ethylene glycol diethyl ether, ethylene glycol methylethyl ether, diethylene glycol dimethyl ether, diethylene glycol diethyl ether, diethylene glycol methylethyl ether, 1,2-dimethoxyethane, bis(2-methoxyethyl)ether, and p-dioxane; and polar compounds such as propylene carbonate, γ-butyrolactone, N-methyl-2-pyrrolidone, dimethylformamide, dimethylsulfoxide, and cyclohexanone can be mentioned.

The ink can suitably contain a filler or a binder. For example, amino-based, epoxy-based, methacryloxy-based, mercapto-based, ketimine-based, cation-based, and other silane coupling agents other than vinyl-based silane coupling agents can be mentioned. Titanate-based, aluminate-based coupling agents may also be contained. Cellulose-based, siloxane, silicon oil, and other binders may also be contained. Containing such additives is intended to improve the dispersibility, adhesiveness to the base, flatness of a film, and so on.

It is preferable that the surface tension of the ink be within the range of 0.02 N/m to 0.07 N/m. In discharging a liquid by the inkjet method, if the surface tension is less than 0.02 N/m, the wettability of the ink composition to the nozzle surface increases and therefore the drop deflection is likely to occur, while if the wettability exceeds 0.07 N/m, the shape of meniscus at the tip of the nozzle is not stable and therefore it is difficult to control the discharge amount and the discharge timing. In order to adjust the surface tension, it is recommended that a minute amount of fluorine-based, silicon-based, nonion-based, and other surface tension adjusting agents be added to the ink unless the contact angle to the substrate is significantly reduced. The nonion-based surface tension adjusting agent enhances the wettability of the liquid to the substrate, improves the leveling of the film, and serves to prevent minute unevenness of the film. The surface tension adjusting agents mentioned above may include alcohol, ether, ester, ketone, and other organic compounds as the need arises.

It is preferable that the ink have a viscosity of 1 mPa·s to 50 mPa·s. In discharging a liquid material as a liquid droplet by the inkjet method, if the viscosity is less than 1 mPa·s, the periphery of the nozzle tends to be contaminated due to the outflow of the ink. On the other hand, if the viscosity is more than 50 mPa·s, the frequency of clogging in a nozzle hole increases, thereby not only making it difficult to smoothly discharge a droplet but also reducing the discharge amount of the droplet.

Figure 8A:
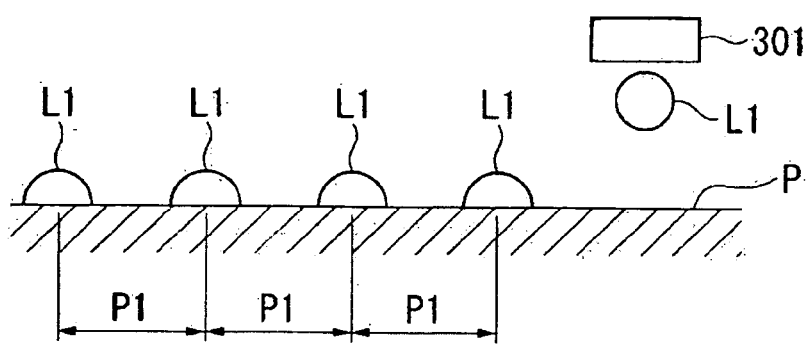
FIGS. 8A to 8C are schematic views showing an exemplary process for forming linear film patterns on a substrate by using an inkjet method.
Figure 8B:
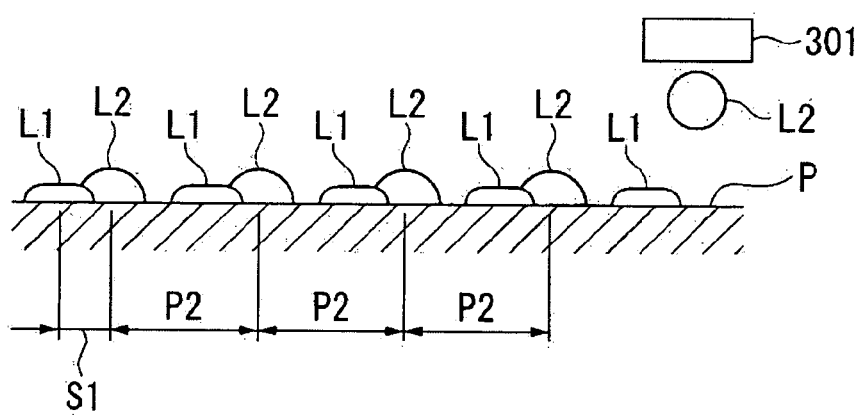
Figure 8C:
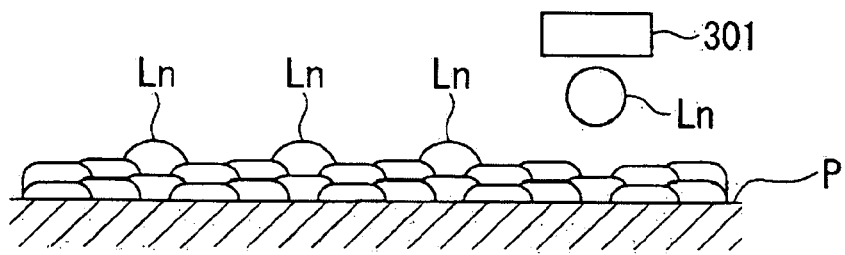

FIGS. 8A to 8C are schematic views showing an exemplary process for forming linear film patterns on a substrate by using the inkjet method.

In the material placing process shown in the drawings, a liquid material is discharged as droplets from the head 301, and the droplets are placed on the substrate P at every certain distance (pitch). By repeating this operation of placing droplets, film patterns are formed on the substrate P.

In the example of FIG. 8A to 8C, droplets L1 discharged from the head 301 are first placed on the substrate P at regular spacing not to contact with each other on the substrate P, as shown in FIG. 8A. That is, the droplets L1 are successively placed on the substrate P at every pitch P1 that is greater than the diameter of the droplet L1 immediately after placed on the substrate P.

After placing the droplets L1 on the substrate P, drying is performed so as to remove the solvent or dispersion medium as needed. The drying may be performed by lamp annealing other than the typical heating by the use of heating means such as a hot plate or an electric furnace. There is no particular restriction on a light source used for lamp annealing; an infrared lamp, a xenon lamp, a YAG laser, an argon laser, a carbon dioxide gas laser, or an excimer laser of XeF, XeCl, XeBr, KrF; KrCl, ArF, ArCl, or the like may be used as the light source.

The drying can be progressed concurrently and in parallel with discharging a liquid material. For example, by heating a substrate beforehand and using a solvent or a dispersion medium having low boiling points concurrently with cooling a liquid discharge head, the drying of a droplet can be performed immediately after the droplets are placed on the substrate.

The droplet placing operation described above is then repeated as shown in FIG. 8B. Namely, in the same manner as in the previous operation shown in FIG. 8A, a liquid material is discharged as droplets L2 from the head 301, and the droplets L2 are placed on the substrate P at every certain distance. At this point the distance between the droplets L2 is the same as in the previous operation (pitch P2=pitch P1), and the droplets L2 do not contact with each other. When placing the droplets L2 is started, the position of the droplet L2 is shifted from the position of the droplet L1, which is placed in the previous operation, by a predetermined distance S1. That is, the droplet L1 of the previous operation and the droplet L2 of this operation placed on the substrate P have the positional relationship in which their center points are apart from each other by the distance S1 mentioned above. The shifted distance (shift amount S1) is, in the embodiment, determined to be smaller than the above P1 or P2 (S1<P1=P2) such that the droplet L1 already placed on the substrate P is partially overlapped with the next droplet L2.

In placing the droplets L2 on the substrate P, the droplets L2 come into contact with the previous droplets L1. However, because the solvent or dispersion medium has already been removed completely or to some extent from the previous droplets L1, it is not frequent that the droplets L1 and L2 coalesce with each other to spread on the substrate P.

Although, in FIG. 8B, the position of starting to place the droplets L2 is at the same side as in the previous operation (left side shown in FIG. 8B), the position may alternatively be at the opposite side (right side shown in FIG. 8B). In this case, the distance of relative movement of the bead 301 and the substrate P can be reduced.

After placing the droplets L2 on the substrate P, drying is performed in the same manner as in the previous operation so as to remove a solvent or a dispersion medium as needed. The degree of heating or light irradiation is allowed to be intensified not only to the extent that the solvent or dispersion medium is removed, but to the extent that a dispersion liquid is converted into a conductive film. However, the degree to the extent of capable of removing the solvent or dispersion medium to some extent is sufficient.

Thereafter, the droplet placing operation described above is repeated plural times as shown in FIG. 8C. In each operation, the distance between the droplets Ln placed (pitch Pn) is the same as that in the first operation (pitch Pn=P1), and is always constant. Accordingly, the droplets Ln immediately after placed on the substrate P do not come to contact with each other, and therefore their coalescence and spread on the substrate P are controlled. In addition, the spread of the droplets placed on the substrate P is controlled by processing the surface of the substrate P into being lyophobic beforehand. The droplets are placed together vertically, thereby increasing the thickness of the liquid material placed on the substrate P.

In repeating the droplet placing operation plural times as shown in FIG. 8C, when placing the droplets Ln is started in each operation, the position of the droplet Ln is shifted from the position of the previous droplet by a predetermined distance. By repeating the droplet placing operation, the spacing between the droplets placed on the substrate P is filled, so that a linear continuous pattern is formed. Additionally, a film pattern on the substrate is formed by placing droplets at the same pitch at all times, and its whole undergoes substantially the same formation process, resulting in its uniform structure.

FIGS. 9A to 10B are views showing exemplary film patterns formed on the substrate. In the example shown in FIGS. 9A to 10B, a plurality of nozzles 325 is arranged in a line in the head 301, and at least one nozzle (three nozzles in this example) of the plurality of nozzles 325 is selectively used to discharge a liquid material towards the substrate P.

Figure 9A:
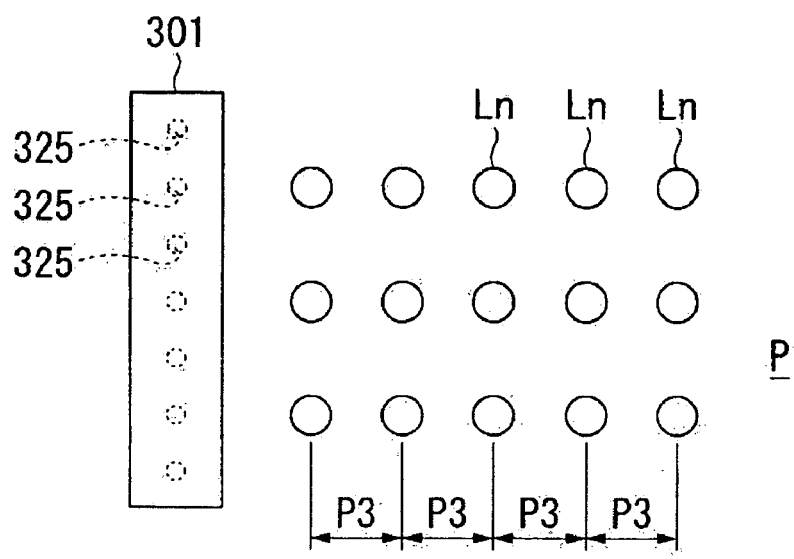
FIGS. 9A, 9B, 10A and 10B are views showing exemplary film patterns formed on the substrate.
Figure 9B:
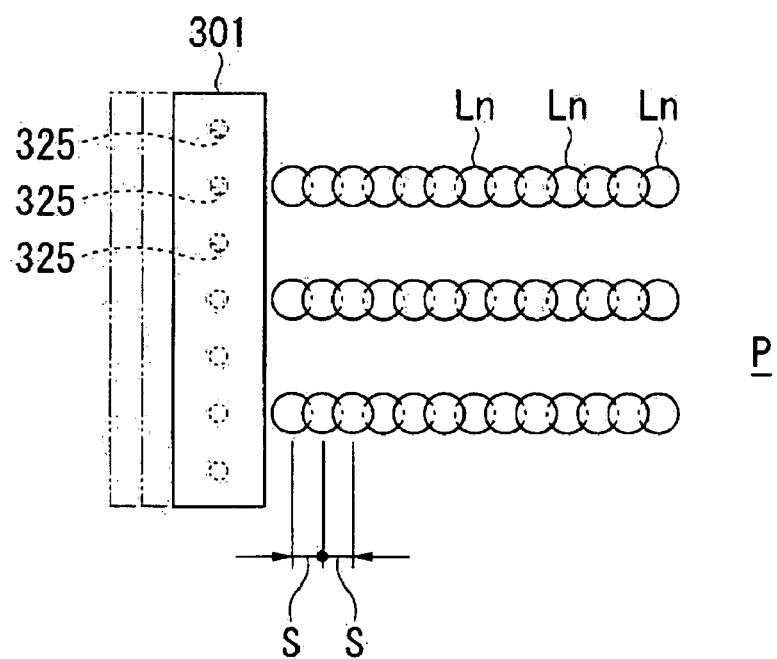

In the example shown in FIGS. 9A and 9B, when the operation of placing the droplets Ln is repeated, the positions at which placing the droplets Ln is started are shifted in the direction orthogonal to the arrangement direction of the plurality of nozzles 325. That is, the operation of placing the droplets Ln is repeated by placing the droplets Ln on the substrate P at predetermined pitch P3 as shown in FIG. 9A and shifting the starting positions in the direction orthogonal to the arrangement direction of the nozzles 325 by a predetermined distance S as shown in FIG. 9B. Thus, the patterns continuous in the direction orthogonal to the arrangement direction of the plurality of nozzles 325 are formed on the substrate P.

In this case, three linear patterns are formed by concurrently discharging the liquid material from the three nozzles among the plurality of nozzles 325 of the head 301.

Figure 10A:
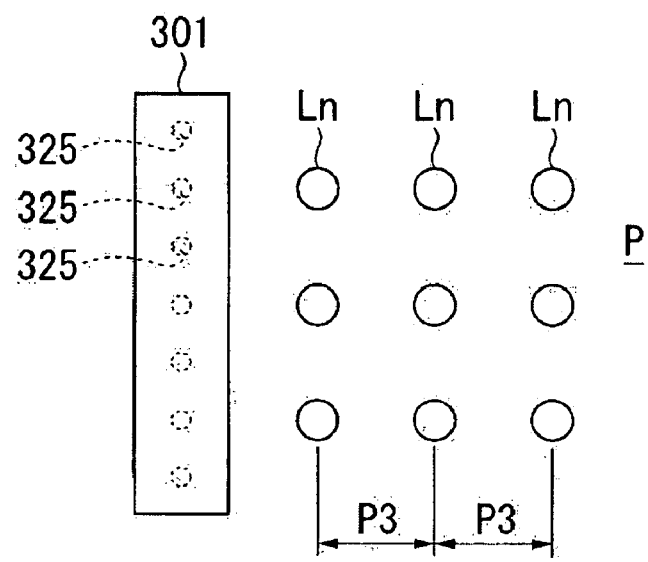
Figure 10B:
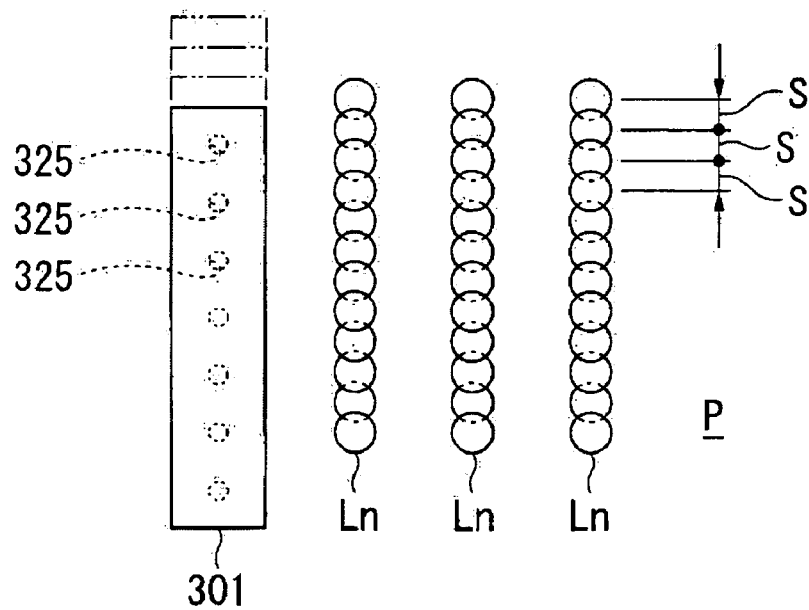

In the example shown in FIGS. 10A and 10B, the positions of starting to place the droplets Ln are shifted in the direction parallel to the arrangement direction of the plurality of nozzles 325 in repeating the operation of placing the droplets Ln. That is, the operation of placing the droplets Ln is repeated by placing the droplets Ln on the substrate P at predetermined pitch P3 as shown in FIG. 10A and shifting the starting positions in the direction parallel to the arrangement direction of the nozzles 325 by a predetermined distance S as shown in FIG. 10B. Thus, the patterns continuous in the arrangement direction of the plurality of nozzles 325 are formed on the substrate P.

In this case, plural numbers of linear patterns are formed depending on the number of droplets placed at predetermined pitch P3.

The plural linear patterns shown in FIGS. 9A and 9B and those shown in FIGS. 10A and 10B are formed to overlap with each other, so that a film of the liquid material can be formed to be planar on the substrate.

The amount of shifting the positions at which placing the droplets is started (shift amount) and the direction of shifting (shift direction) are not restricted to those above. For example, in repeating the droplet placing operation, the positions of starting to place the droplets may be shifted in a direction oblique to the arrangement direction of nozzles 325. In this case, it is possible to form continuous patterns that are oblique with respect to the direction of arranging the plurality of nozzles 325.

As described above, films having a variety of shapes can be formed on a substrate by suitably determining nozzles to be used, the pitch for placing droplets, the distance of shifting the starting positions (shift amount), the direction of shifting (shift direction), etc., in the inkjet method.

Films having better shapes can also be formed by appropriately controlling the combination parameters of the amount of a droplet, the pitch for placing droplets, and wettability of the surface of a substrate.

Figure 11A:
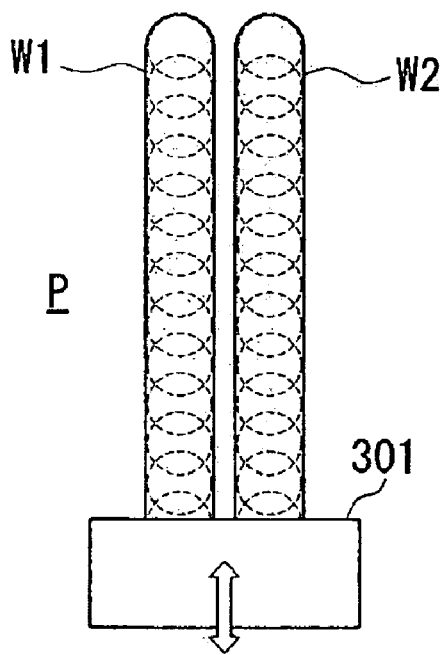
FIGS. 11A and 11B are schematic views showing another example of processes for forming linear film patterns on a substrate by using the inkjet method.
Figure 11B:
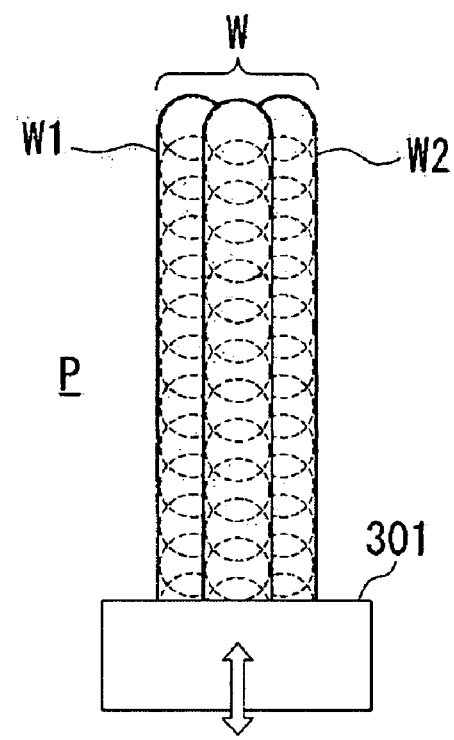

FIGS. 11A and 11B are schematic views showing another example of a process for forming linear film patterns on the substrate by using the inkjet method.

The material placing process includes a first operation of forming a plurality of linear patterns on the substrate (FIG. 11A) and a second operation of integrating the plurality of linear patterns (FIG. 11B).

In the first operation, a liquid material is discharged as droplets from the head 301, and the droplets are placed on the substrate P at every certain distance (pitch), as shown in FIG. 11A. By repeating the placing droplets, a plurality of linear patters (two linear patterns in this example) W1 and W2 are formed on the substrate P.

The conditions of discharging the droplets, especially the volume of a droplet and the pitch for arranging the droplets, are decided such that the shapes of the ends of the linear patterns W1 and W2 are in a good state with minute unevenness. In addition, the spread of the droplets placed on the substrate P is controlled by processing the surface of the substrate P into being lyophobic beforehand. As a result, the shapes of the ends of the linear patterns can reliably be controlled to be in the good state mentioned above.

The plurality of linear patterns W1 and W2 may be formed either at a time or separately, one at a time. If the plurality of linear patterns is formed separately, one at a time, the total number of drying can be increased as compared to forming two linear patterns at a time, and therefore it is recommended in the separate formation to set out the conditions for drying so that lyophobicity of the substrate P is not impaired.

The plurality of linear patterns W1 and W2 are arranged at positions separate with each other in this example, but may be arranged to partially overlap with each other.

In the second operation, the liquid material is discharged as droplets from the head 301 and placed between the plurality of linear patterns W1 and W2 to integrate the plurality of linear patterns W1 and W2 into one, as shown in FIG. 11B.

Figure 12C:
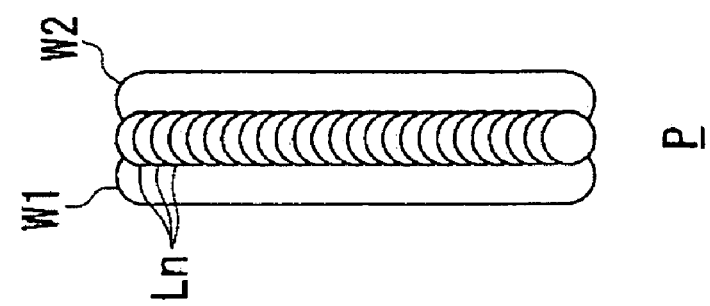
FIGS. 12A to 12C are views showing examples of placing a plurality of droplets between a plurality of linear patterns.
Figure 12B:
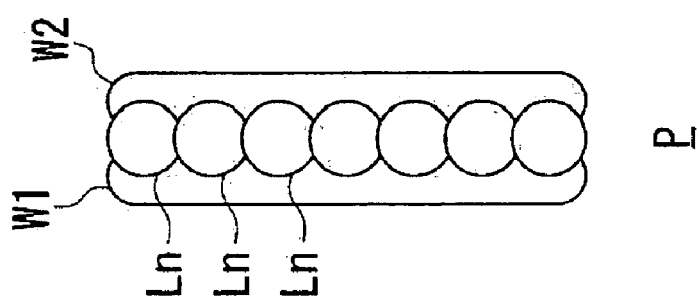
Figure 12A:
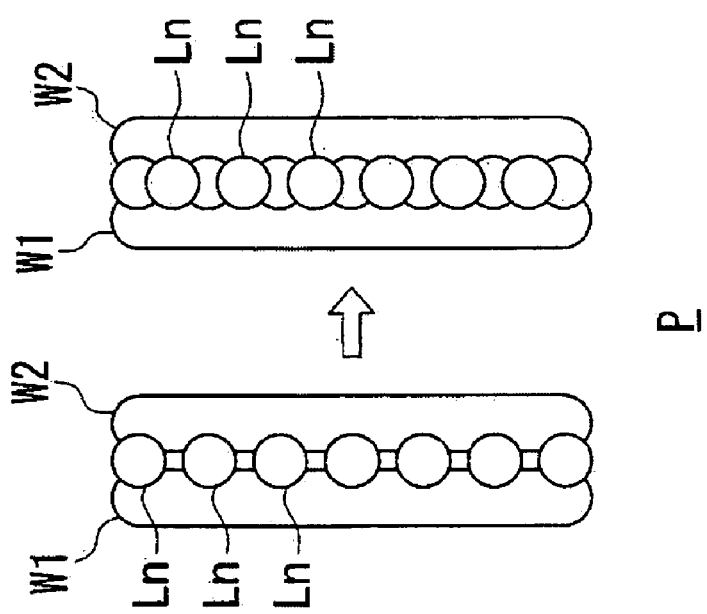

FIGS. 12A to 12C show examples of placing a plurality of droplets between a plurality of linear patterns W1 and W2 in the above second operation.

In the example shown in FIG. 12A, a plurality of droplets Ln are placed between the plurality of linear patterns W1 and W2 under the same droplet discharge conditions as in the first operation described above. That is, the plurality of droplets Ln, each having the same volume as in the first operation, is placed at the same pitch as in the first operation between the plurality of linear patterns W1 and W2, and this placing is repeated plural times. A recess is formed between the plurality of linear patterns W1 and W2, which serve as its walls. The plurality of droplets Ln is successively contained into the inside of the recess.

The droplet placing is repeated, for example, until the recess mentioned above is filled with the droplets (liquid material). In the second operation, drying for removing the dispersion medium may be performed in the same manner as in the first operation at each droplet placing, which is repeated successively. However, drying may also be omitted. Namely, in the second operation, even if undried droplets overlap with each other on the substrate, the plurality of linear patterns W1 and W2 serve as the walls, preventing the spread of the droplets on the substrate P. Improvement of throughput is achieved by omitting the drying.

In the example shown in FIG. 12B, differently from the discharging conditions of the first operation described above, the volume of the droplet Ln is greater than that in the first operation. That is, the amount of the liquid material discharged at a time is increased. In this example, the pitch for placing the droplets Ln is equal to that in the first operation. The recess formed by the plurality of linear patterns W1 and W2 is filled with the droplets for a short time by increasing the volume of the droplet Ln.

In the example shown in FIG. 12C, differently from the discharging conditions of the first operation described above, the pitch for placing the droplets Ln is narrower than that in the first operation. The volume of the droplet Ln may be either equal to or greater than that in the first operation as shown in FIG. 12B. Narrowing the pitch for placing the droplets increases the amount of droplets placed per unit area, and therefore the recess formed by the plurality of linear patterns W1 and W2 is filled with the droplets for a short time.

Returning to FIG. 11B, the plurality of droplets is placed between the plurality of linear patterns W1 and W2, and the recess therebetween is filled with the droplets (liquid material). Thus, the plurality of linear patterns W1 and W2 are integrated with each other to form one linear pattern W. The line width of this linear pattern includes the line widths of the plurality of linear patterns W1 and W2 formed above and therefore is made larger.

In this case, the line width of the final linear pattern W is determined depending on the distance between the plurality of linear patterns W1 and W2 formed in the first operation. That is, the width of the final linear pattern W after being integrated can be controlled by altering the distance between the plurality of linear patterns formed in the first operation.

The film thickness of the linear pattern W after being integrated can also be controlled by altering the heights (thicknesses) of the plurality of linear patterns W1 and W2 formed in the first operation from the surface of the substrate. For example, the film thickness of the linear pattern W after integrated can readily be increased by increasing the heights of the plurality of linear patterns W1 and W2 formed in the first operation.

In addition, two linear patterns are formed in the first operation in this example, but three or more linear patterns may be formed. A linear pattern with a larger line width can readily be formed by increasing the number of linear patterns integrated. In placing ink on the substrate, the spread of the droplets placed on the substrate P is controlled by processing the surface of the substrate P into being lyophobic beforehand. Hence, the film thickness is made larger and the shape is made stable.

In the process of making the surface lyophobic, the surface of the substrate on which a film is formed is processed to be lyophobic to the liquid material. Specifically, surface processing is applied so that a predetermined contact angle to the liquid material is not less than 60 deg., preferably not less than 90 deg. nor more than 110 deg.

As methods to control lyophobicity (wettability) of the surface, for example, a method of forming a self-assembled film on the surface of a substrate, a plasma treatment method, and the like can be employed.

In the method of forming a self-assembled film, a self-assembled film including an organic molecule film and others is formed on the surface of a substrate on which the film is to be formed.

The organic molecule film to treat the substrate surface includes a functional group capable of being bonded to the substrate, a functional group to modify the surface properties of the substrate (control the surface energy) such as a lyophilic group or a lyophobic group at the opposite side, and a normal chain of carbon or a carbon chain having a branch on a part thereof that combines these functional groups. The organic molecule film is bonded to the substrate and is self-assembled to form a molecular film such as a monomolecular film.

The self-assembled film described herein is a film that includes a binding functional group, which can react with constituent atoms of a base layer such as a substrate, and normal chain molecules. The self-assembled film is formed by orienting a compound having extremely high orientation due to the interaction of the normal chain molecules. Because the self-assembled film is formed by orienting monomolecules, the film thickness can be made extremely small and, in addition, the film is made uniform on the molecular level. That is, because the same molecules are located on the surface of the film, uniform and excellent lyophobicity or lyophilicity can be imparted to the surface of the film.

By using flouroalkylsilane, for example, as the compound having the above high orientation, the self-assembled film is formed with the compounds oriented so that a fluoroalkyl group is located on the surface of the film. Thus, uniform lyophobicity is imparted to the surface of the film.

As the compound for forming a self-assembled film, there may be cited flouroalkylsilane (hereinafter, refer to as "FAS") such as heptadecafluoro-1,1,2,2-tetrahydrodecyltriethoxysilane, heptadecafluoro-1,1,2,2-tetrahydrodecyltrimethoxysilane, heptadecafluoro-1,1,2,2-tetrahydrodecyltrichlorosilane, tridecafluoro-1,1,2,2-tetrahydrooctyltriethoxysilane, tridecafluoro-1,1,2,2-tetrahydrooctyltrimethoxysilane, tridecafluoro-1,1,2,2-tetrahydrooctyltrichlorosilane, or trifluoropropyltrimethoxysilane. As regards use of the compound, one compound may be singularly used, and two or more types of compounds may be used in combination with each other. Adhesion of the substrate and excellent lyophobicity can be obtained by using FAS.

FAS is generally expressed by a constitutional formula RnSiX(4–n). In this expression, n expresses an integer not less than 1 nor more than 3, and X is a hydrolysable group such as a methoxy group, an ethoxy group, or a halogen atom. R is a fluoroalkyl group and has a structure of (CF3)(CF2)x(CH2)y (where x expresses an integer not less than 0 nor more than 10, and y expresses an integer not less than 0nor more than 4); if a plurality of Rs or Xs are bonded to Si, Rs or Xs may be the same or different from one another. The hydrolysable group expressed by X forms silanol by the hydrolysis, and reacts with a hydroxyl group of a base such as a substrate (glass, silicon) to bind the substrate by a siloxane bond. On the other hand, R has a fluoro group such as (CF3) on its surface, and therefore modifies a base surface such as a substrate to a surface that does not become wet (surface energy is low).

The self-assembled film including the organic molecule film and others is formed on the substrate by putting the above material compound and the substrate into the same airtight container and leaving them for two or three days at room temperature. If the entire airtight container is kept at 100° C., it takes around three hours to form the self-assembled film on the substrate. The above description is a formation method from the vapor phase, but the self-assembled film can be formed from the liquid phase. For example, by immersing a substrate in a solution containing a material compound, and cleaning and drying it, a self-assembled film is obtained on the substrate.

Prior to forming a self-assembled film, it is preferable to perform pretreatment by applying ultraviolet radiation to the substrate surface or cleaning it with a solvent.

In the plasma treatment method, a substrate is exposed to plasma at normal pressures or in vacuum. Various types of gases can be selected for use in plasma treatment considering the material quality of the surface of the substrate on which conductive film wiring is to be formed. As treatment gases, for example, tetrafluoromethane, perfluorohexane, perfluorodecan, etc., can be mentioned.

In addition, the process of making the surface of a substrate lyophobic can be performed alternatively, for example, by adhering a polyimide film process with ethylene fluoride to the substrate surface. It is also sufficient to use the polyimide film without processing as the substrate.

If the substrate surface has higher lyophobicity than a predetermined lyophobicity, it is desired to perform the process of making the substrate surface lyophobic by application of 170 to 400 nm ultraviolet radiation and exposure of the substrate to ozone atmosphere so as to control the state of the surface.

Figure 13:
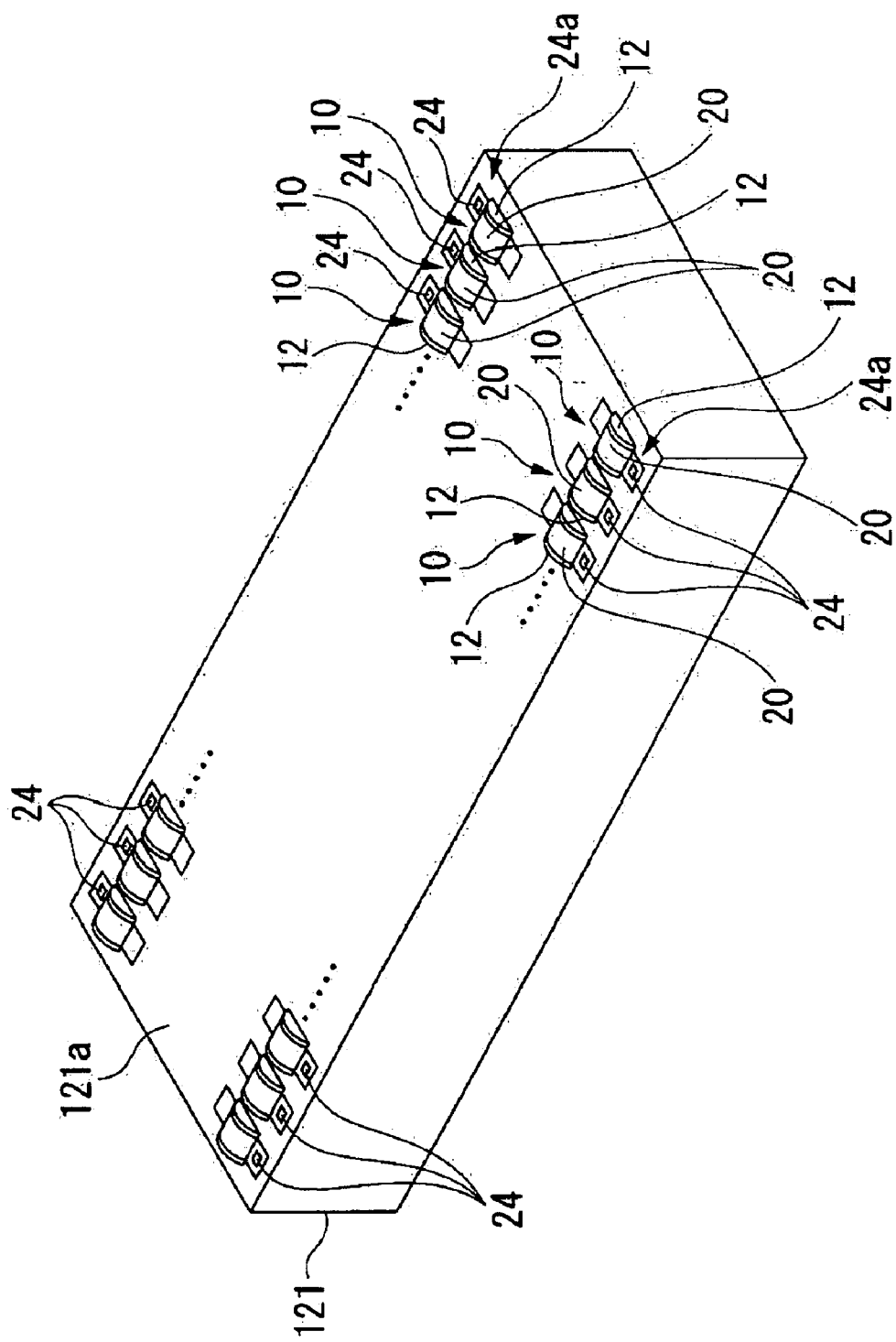
FIG. 13 is a perspective view showing another example of the semiconductor device.

FIG. 13 is a partial perspective view that shows a structure of the active surface side of the semiconductor device 121 on which terminals are formed. It should be noted that, in the following description, such elements as are found also in the embodiment described above are indicated by the same reference numbers, and overlapping explanations will be omitted or simplified.

In the embodiment, the plurality of resin projections 12 are formed in approximately the same straight line on the active surface 121a as shown in FIG. 13, whereas, in the semiconductor device 121 shown in the foregoing FIG. 3, the resin projection 12 linearly extending at approximately the same height is formed on the active surface 121a. The plurality of resin projections 12 is formed, being aligned in one-to-one correspondence with the electrode pads 24. The conductive film 20 is formed on each of the resin projections 12.

Each bump electrode 10 discretely has the resin projection 12 as its core, and thus elastic deformation occurs more reliably in each bump electrode 10 when the semiconductor device 121 is mounted, leading to reliability improvement in conductive connection to the other substrate. In the manufacturing method of the invention, since the resin projections 12 are formed using the inkjet method, such the plurality of resin projections 12 as are arranged apart from each other like islands can readily be formed.

The arrangement relationship of the plurality of resin projections 12 to the electrode pads 24 is not limited to one to one. One resin projection 12 may be arranged for several electrode pads 24.

Electronic Apparatus

An electronic apparatus with the electro-optic device or the semiconductor device described above will next be described.

Figure 14:
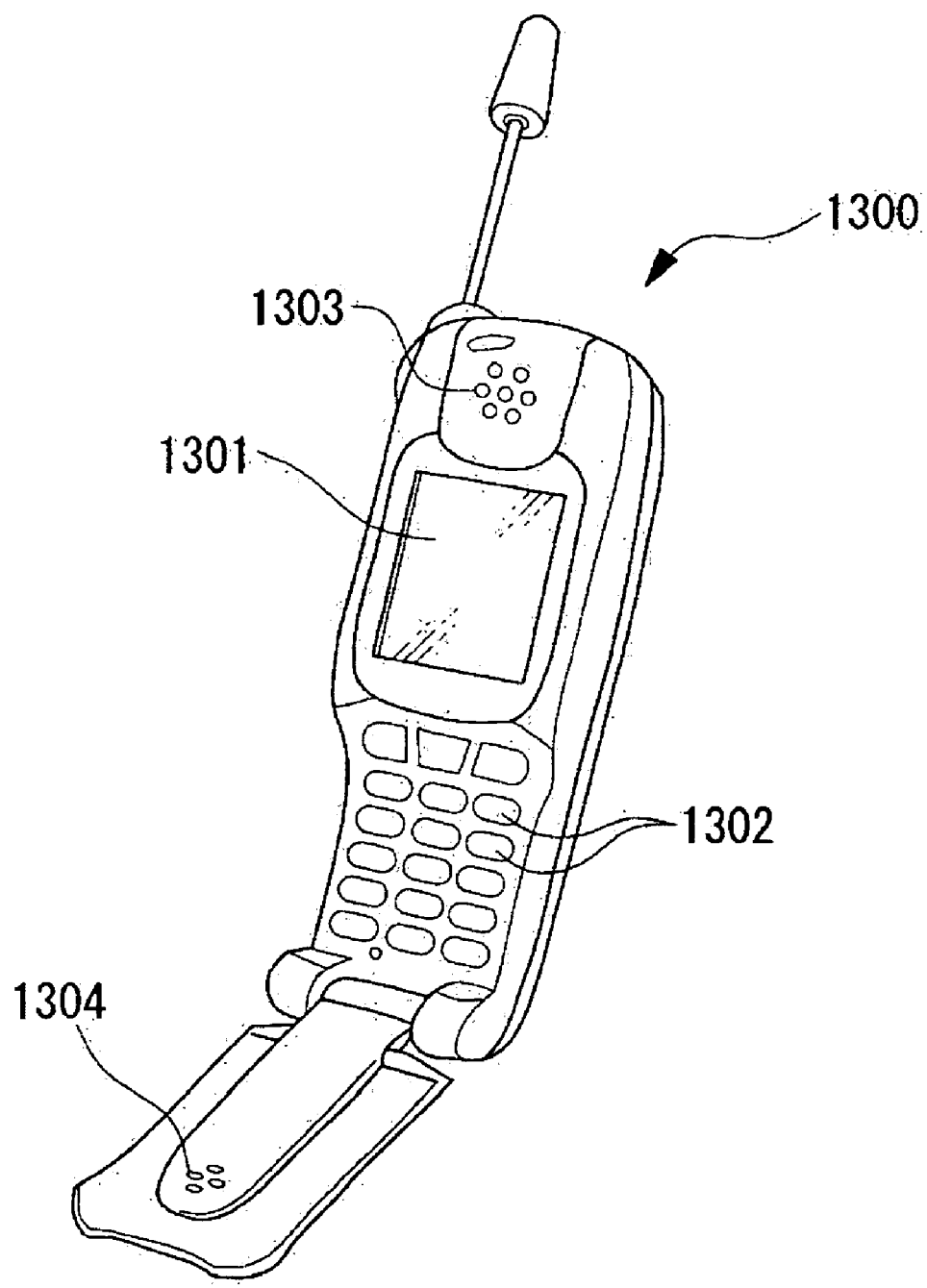
FIG. 14 is a perspective view showing an exemplary electronic apparatus.

FIG. 14 is a perspective view showing an exemplary electronic apparatus according to the invention. A mobile phone 1300 shown in this drawing is structured to have the electro-optic device described above as a small size display 1301, a plurality of operation buttons 1302, an earpiece 1303, and a mouthpiece 1304.

The electro-optic device described above is not limited to the mobile phone described above, but can preferably be used as image display means for an electronic book, a personal computer, a digital still camera, a liquid crystal display television, a viewfinder type or monitor-direct-view-type video tape recorder, a car navigation device, a pager, an electronic organizer, an electronic calculator, a word processor, a work station, a videophone, a POS terminal, an apparatus having a touch panel, and so on. In any case, an electronic apparatus having excellent reliability in electric connection can be provided.

The preferable embodiment according to the invention has been described with reference to the accompanying drawings, but it will be appreciated that the invention is not limited thereto. Forms and combinations of elements referred to in the example described above are illustrative, and can be modified in various manners based on design demands and the like without departing from the spirit and scope of the invention.

What is claimed is:

1. A method for manufacturing a semiconductor device with a bump electrode, the bump electrode including a resin material as a core and having at least a top surface covered with a conductive film, the method comprising:
    placing the resin material on a substrate on which an electrode terminal is formed, the resin material being placed by an inkjet method;
    drying the resin material; and
    forming an interconnecting metal that connects the electrode terminal to the top surface of the resin material, wherein:
    the placing of the resin material and the drying of the resin material are repeated.

2. The method for manufacturing a semiconductor device according to claim 1, wherein the resin material is placed by dropping a plurality of droplets from a discharger.

3. The method of manufacturing a semiconductor device according to claim 2, wherein the discharger has a plurality of nozzles for discharging droplets.

4. The method of manufacturing a semiconductor device according to claim 1, further comprising processing at least part of an area of a surface of the substrate to be lyophobic to the resin material before placing the resin material.

5. The method of manufacturing a semiconductor device according to claim 1, wherein a resin projection extending linearly at approximately a uniform height is formed on the substrate by placing the resin material.

6. The method of manufacturing a semiconductor device according to claim 1, wherein a plurality of resin projections aligned approximately on one straight line is formed on the substrate by placing the resin material.

7. The method of manufacturing a semiconductor device according to claim 1, wherein the interconnecting metal is formed by using an inkjet method.

8. The method of manufacturing a semiconductor device according to claim 7, wherein placing a droplet containing a material for forming the interconnecting metal at every certain distance on the substrate is repeated while shifting a starting position to place the droplet.

9. A semiconductor device manufactured by using the method of manufacturing a semiconductor device according to claim 1.

10. A circuit board on which the semiconductor device according to claim 9 is mounted.

11. An electro-optic device having the circuit board according to claim 10.

12. An electronic apparatus having the electro-optic device according to claim 11.

13. A method of manufacturing a semiconductor device with a bump electrode comprising:
    providing a substrate on which an electrode terminal is formed;
    disposing a resin material on the substrate by an inkjet method;
    drying the resin material; and
    connecting the electrode terminal to a top surface of the resin material with an interconnecting metal such that the bump electrode is formed with the resin material as a core and a conductive film covering at least a top surface of the resin material, wherein:
    the disposing of the resin material and the drying of the resin material are repeated.

14. A method for manufacturing a semiconductor device with a bump electrode, the bump electrode including a resin material as a core and having at least a top surface covered with a conductive film, the method comprising:
    placing the resin material on a substrate on which an electrode terminal is formed, the resin material being placed by an inkjet method; and
    forming an interconnecting metal that connects the electrode terminal to the top surface of the resin material, wherein the interconnecting metal is formed by using an inkjet method, and wherein placing a droplet containing a material for forming the interconnecting metal at every certain distance on the substrate is repeated while shifting a starting position to place the droplet.

* * * * *